US009461093B2

(12) United States Patent
Conraux

(10) Patent No.: US 9,461,093 B2
(45) Date of Patent: Oct. 4, 2016

(54) SELF-REFERENCED MRAM ELEMENT AND DEVICE HAVING IMPROVED MAGNETIC FIELD

(71) Applicant: CROCUS Technology SA, Grenoble (FR)

(72) Inventor: Yann Conraux, Sassenage (FR)

(73) Assignee: CROCUS TECHNOLOGY SA, Grenoble (FR)

(*) Notice: Subject to any disclaimer, the term of this patent is extended or adjusted under 35 U.S.C. 154(b) by 0 days.

(21) Appl. No.: 14/437,362

(22) PCT Filed: Oct. 11, 2013

(86) PCT No.: PCT/EP2013/071357
§ 371 (c)(1),
(2) Date: Apr. 21, 2015

(87) PCT Pub. No.: WO2014/063938
PCT Pub. Date: May 1, 2014

(65) Prior Publication Data
US 2015/0287764 A1 Oct. 8, 2015

(30) Foreign Application Priority Data

Oct. 22, 2012 (EP) .................................. 12290360

(51) Int. Cl.
*H01L 27/22* (2006.01)
*G11C 11/16* (2006.01)
(Continued)

(52) U.S. Cl.
CPC ............. *H01L 27/222* (2013.01); *G11C 11/15* (2013.01); *G11C 11/16* (2013.01); *G11C 11/161* (2013.01);
(Continued)

(58) Field of Classification Search
CPC ..... H01L 27/222; H01L 43/08; H01L 43/02; H01L 43/10; H01L 27/226; H01L 27/228; G11C 11/16; G11C 11/15; G11C 11/161; G11C 11/175; G11C 14/0036; G11C 14/0081; G01R 33/09; G01R 33/098
See application file for complete search history.

(56) References Cited

U.S. PATENT DOCUMENTS 6,597,049 B1   7/2003  Bhattacharyya et al.
6,865,105 B1 * 3/2005  Tran ..................... G11C 11/15
                                                                365/158

(Continued)

OTHER PUBLICATIONS

International Search Report for PCT/EP2013/071357 dated Jan. 2, 2014.
Written Opinion for PCT/EP2013/071357 dated Dec. 23, 2013.

*Primary Examiner* — Galina Yushina
(74) *Attorney, Agent, or Firm* — Pearne & Gordon LLP

(57) ABSTRACT

Self-reference-based MRAM element including: first and second magnetic tunnel junctions, each having a magnetoresistance that can be varied; and a field line for passing a field current to vary the magnetoresistance of the first and second magnetic tunnel junctions. The field line includes a first branch and a second branch each branch including cladding. The first branch is arranged for passing a first portion of the field current to selectively vary the magnetoresistance of the first magnetic tunnel junction, and the second branch is electrically connected in parallel with the first branch and arranged for passing a second portion of the field current to selectively vary the magnetoresistance of the second magnetic tunnel junction. The self-referenced MRAM element and an MRAM device including corresponding MRAM elements can use a reduced field current.

11 Claims, 4 Drawing Sheets

(51) Int. Cl.
*H01L 43/08* (2006.01)
*G11C 11/15* (2006.01)
*H01L 43/02* (2006.01)
*H01L 43/10* (2006.01)

(52) U.S. Cl.
CPC ......... *G11C 11/1675* (2013.01); *H01L 27/226* (2013.01); *H01L 43/02* (2013.01); *H01L 43/08* (2013.01); *H01L 43/10* (2013.01); *H01L 27/228* (2013.01)

(56) References Cited

U.S. PATENT DOCUMENTS

| | | | |
|---|---|---|---|
| 8,031,519 B2 | 10/2011 | Javerliac et al. | |
| 2005/0205952 A1 | 9/2005 | Park et al. | |
| 2006/0023490 A1* | 2/2006 | Boeve | G11C 11/16 365/158 |
| 2006/0139992 A1* | 6/2006 | Hwang | G11C 11/15 365/158 |
| 2009/0316476 A1* | 12/2009 | Javerliac | G11C 5/063 365/173 |
| 2011/0002151 A1* | 1/2011 | Javerliac | G11C 11/16 365/50 |

* cited by examiner

SELF-REFERENCED MRAM ELEMENT AND DEVICE HAVING IMPROVED MAGNETIC FIELD

FIELD

The present disclosure concerns a self-referenced magnetic random access memory (MRAM) element having a field line adapted to provide an improved magnetic field. The present disclosure further concerns a self-referenced MRAM device comprising the MRAM elements.

DESCRIPTION OF RELATED ART

Self-referenced MRAM devices comprise a plurality of MRAM cells sharing common conducting lines. In particular, the plurality of MRAM cells can share a field line being arranged for passing a field current for generating a magnetic field destined to the writing of the MRAM cells and/or to the reading of the MRAM cells.

FIG. 1 illustrates a self-referenced MRAM element such as the one described in U.S. Pat. No. 8,031,519 by the present applicant. More particularly, the elevation view of FIG. 1 shows the MRAM element 1 comprising a first and second magnetic tunnel junction 2, 2', a first strap 7 electrically connecting one end of the first magnetic tunnel junction 2 to a first CMOS selection transistor 8, and a second strap 7' electrically connecting one end of the second magnetic tunnel junction 2' to a second CMOS selection transistor 8'. The MRAM element further comprises a common field line 5 addressing the first and second magnetic tunnel junction 2, 2', and a current line 3 connected to the other end of the first and second magnetic tunnel junction 2, 2'. In FIG. 1, the field line 5 is represented orthogonal to the page and perpendicular to the current line 3. FIG. 2 is a top view of a self-referenced MRAM device comprising a plurality of the MRAM elements 1. In the figure, the MRAM elements 1 are arranged in a row, along the field line 5. FIG. 3 represents another possible configuration of a MRAM element 1 where each magnetic tunnel junction 2 is connected to a current line 3 being arranged parallel to the field line 5.

In the above configurations of self-referenced MRAM elements, a magnetic field generated by the field current passing in the field line 5 varies a magnetoresistance of the magnetic tunnel junction 2, such that the MRAM element 1 can be written or read. Writing and/or reading the MRAM element requires passing the field current with a magnitude being high enough for the generated magnetic field to be able to vary/switch a magnetization of the magnetic tunnel junction 2. Indeed, the magnetic field should have a magnitude being typically comprised between 0 and 200 Oe, and preferably between 50 and 100 Oe.

In low power application, such as in mobile devices, high field currents are detrimental. The same applies for applications requiring a MRAM device having a high surface density of MRAM elements where high magnetic fields must be generated by small field lines.

Obtaining a self-referenced MRAM element and device wherein the field line is capable of generating a larger magnetic field for a given field current would thus be advantageous.

SUMMARY

The present disclosure concerns a self-reference-based MRAM element comprising a first magnetic tunnel junctions and a second magnetic tunnel junctions, each having a magnetoresistance that can be varied; and a field line for passing a field current destined to vary the magnetoresistance of the first and second magnetic tunnel junctions; the field line comprising a first branch and a second branch electrically connected in parallel with the first branch, the first branch being arranged for passing a first portion of the field current to selectively vary the magnetoresistance of the first magnetic tunnel junction, and the second branch being arranged for passing a second portion of the field current to selectively vary the magnetoresistance of the second magnetic tunnel junction.

In an embodiment, the first and second branches can be arranged so that a first portion of magnetic field generated by passing the first portion of field current in the first branch can only vary the magnetization of the first magnetic tunnel junction, and a second portion of magnetic field generated by passing the second portion of field current in the second branch can only vary the magnetization of the second magnetic tunnel junction.

In another embodiment, each of the first and second branches can comprise a cladding. Each of the first and second branches can have a rectangular cross section, and the cladding can be comprised on three sides of the rectangular cross section. The cladding can comprise a ferromagnetic material such as a NiFeCo alloy.

In yet another embodiment, the MRAM element can further comprise at least one current line electrically connected to one end each of the first and second magnetic tunnel junctions.

The present disclosure also concerns a MRAM device comprising a plurality of the MRAM elements. The plurality of the MRAM elements can be arranged in rows and columns, and the field line can extend along a row of MRAM elements with the first branch extending along the first magnetic tunnel junctions such as to selectively vary the magnetoresistance of the first magnetic tunnel junction of the MRAM elements in the row when the first portion of the field current is passed. The second branch can extend along the second magnetic tunnel junctions such as to selectively vary the magnetoresistance of the second magnetic tunnel junction of the MRAM elements in the row when the second portion of the field current is passed.

The disclosed self-referenced MRAM element and MRAM device can use a reduced field current in comparison to the one used in conventional self-referenced MRAM elements and devices. The magnetoresistance of the first and second magnetic tunnel junctions can also be varied with increased selectivity.

BRIEF DESCRIPTION OF THE DRAWINGS

The disclosure will be better understood with the aid of the description of an embodiment given by way of example and illustrated by the figures, in which.

DETAILED DESCRIPTION OF POSSIBLE EMBODIMENTS

Figure 4:
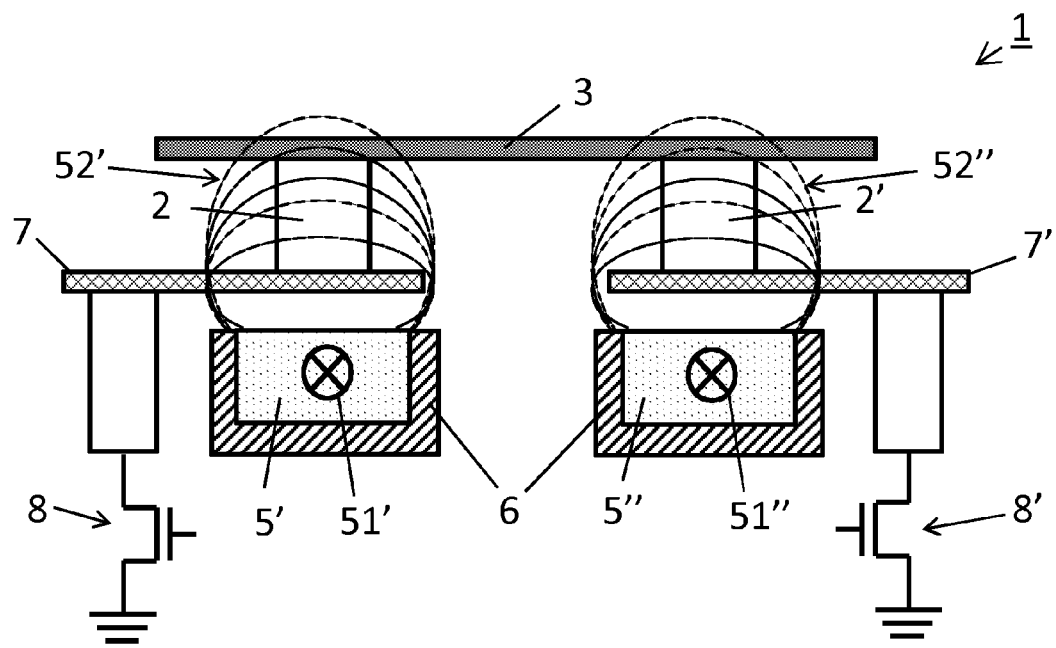
FIG. 4 illustrates a self-referenced MRAM element, according to an embodiment.

FIG. 4 illustrates an elevation view of a self-reference MRAM element 1 according to an embodiment. The MRAM element 1 comprises a first magnetic tunnel junction 2 and a second magnetic tunnel junction 2', a field line 5 for passing a field current 51. The first and second magnetic tunnel junction 2, 2' comprises a magnetoresistance that can be varied with an external magnetic field. In an embodiment not represented, the first and second magnetic tunnel junction 2, 2' comprises a first ferromagnetic layer having a first magnetization that can be varied with the magnetic field, a barrier layer, and a second ferromagnetic layer having a second magnetization that is fixed or that can also be varied in the magnetic field. Here, the magnetic field varying the magnetoresistance of the first and second magnetic tunnel junctions 2, 2' is generated by passing the field current 51 in the field line 5.

The field line 5 comprises a first branch 5' and a second branch 5" electrically connected in parallel with the first branch 5'. The first branch 5' is arranged for passing a first portion 51' of the field current and the second branch 5" is arranged for passing a second portion 51" of the field current. In this arrangement, the first portion 51' of the field current generates a first portion 52' of magnetic field that is capable of switching the first magnetization of the first ferromagnetic layer (or the second magnetization of the second ferromagnetic layer), such as to vary the magnetoresistance of the first magnetic tunnel junction 2. Similarly, the second portion 51" of the field current generates a second portion 52" of magnetic field that is capable of varying the magnetoresistance of the second magnetic tunnel junction 2'. Preferably, the first and second branches 5', 5" are arranged so that the first portion 52' of magnetic field generated by passing the first portion 51' of field current in the first branch 5' can only vary the magnetization of the first magnetic tunnel junction 2, and the second portion 52" of magnetic field generated by passing the second portion 51" of field current in the second branch 5" can only vary the magnetization of the second magnetic tunnel junction 2'.

In the configuration of FIG. 4, the MRAM element 1 further comprise a first strap 7 electrically connecting one end of the first magnetic tunnel junction 2 to a first CMOS selection transistor 8, and a second strap 7' electrically connecting one end of the second magnetic tunnel junction 2' to a second CMOS selection transistor 8'. The strap 7, 7' allows for placing the first and second branch 5', 5" underneath the first and second magnetic tunnel junction 2, 2', respectively, such that the first and second branches 5', 5" can be located in close proximity to the first and second magnetic tunnel junction 2, 2', respectively. The proximity of the first and second branch 5', 5" to the first and second magnetic tunnel junctions 2, 2' alloys for the generated first magnetic field 52' to interact only with the first magnetic layer 2 and the generated second magnetic field 52" to interact only with the second magnetic layer 2'. This arrangement thus allows for improving the selectivity in varying the magnetoresistance of the first and second magnetic tunnel junctions 2, 2' during writing and/or reading operation.

Figure 1:
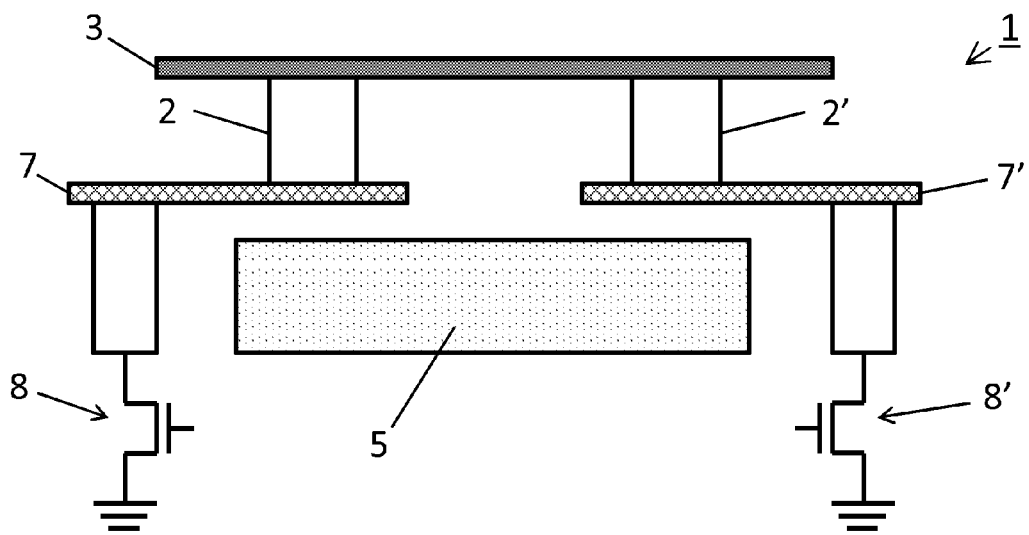
FIG. 1 illustrates a conventional self-referenced MRAM element.
Figure 2:
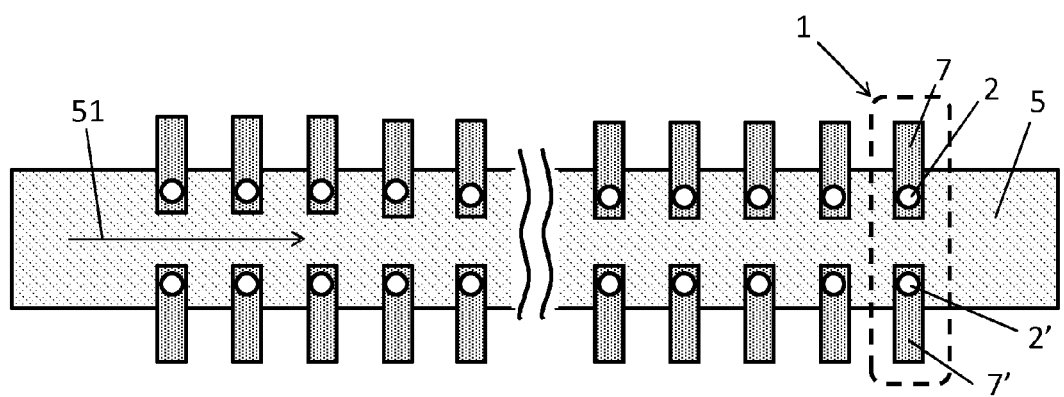
FIG. 2 is a top view of a self-referenced MRAM device comprising a plurality of the MRAM elements of FIG. 1.
Figure 3:
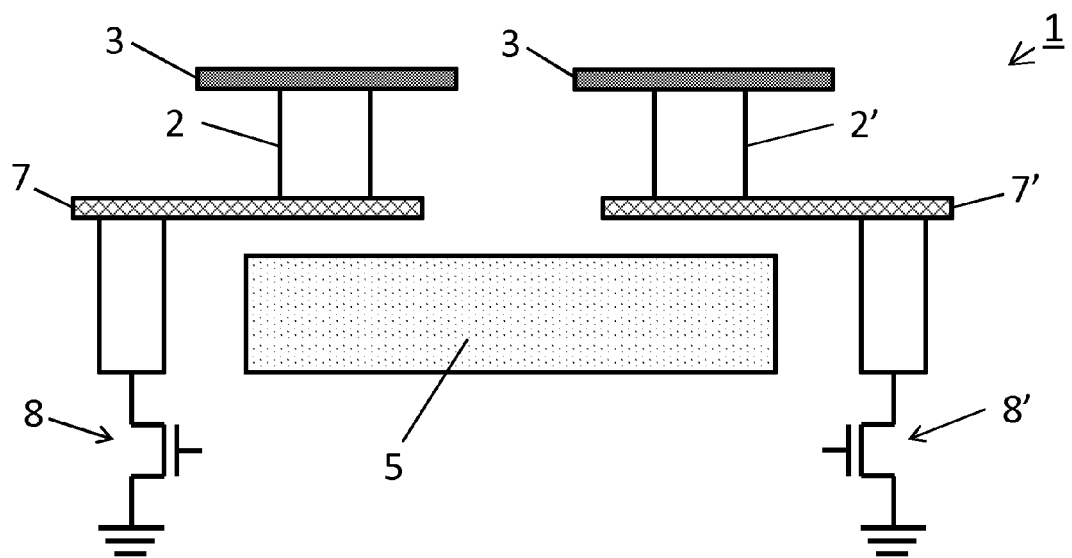
FIG. 3 represents a conventional self-referenced MRAM element in another configuration.

The MRAM element 1 can further comprise a current line 3 connected to the other end of the first and second magnetic tunnel junction 2, 2'. In FIG. 1, the first and second branches 5', 5" are represented orthogonal to the page and to the current line 3. In the case of a thermally assisted writing operation of the MRAM element 1, a heating current 31 can be passed in the current line 3 and in the magnetic tunnel junction 2, 2' having its transistor 8, 8' being set in a passing mode.

In a preferred embodiment, at least a portion of each of the first and second branches 5', 5" comprise a cladding 6. In the particular example of FIG. 4, the first and second branch 5', 5" has a rectangular cross section. The cladding 6 embeds three sides of the rectangular cross section, leaving the side proximal to the magnetic tunnel junction 2, 2' uncladded. The cladding 6 focuses the magnetic field 52', 52" towards the magnetic tunnel junction 2, 2', increasing the intensity of the magnetic field 52', 52" in the region of the magnetic tunnel junction 2, 2' as compared to the magnetic field produced by uncladded branches 5', 5". In FIG. 4 the magnetic field 52', 52" is represented by the magnetic flux lines closing tightly on each branch 5', 5" due to the proximity of the two opposite sides of the cladding 6. Consequently, the cladding 6 allows for using a reduced field current 51', 51", in comparison to the one required with uncladded branches 5', 5", to generate a magnetic field able to vary the magnetoresistance of the magnetic tunnel junction 2, 2'.

For an uncladded field line, the magnetic field H is given by the equation H=I/2 w, where I is the current flowing through the branch 5', 5" and w is the width of the branch 5', 5". Here, the field loss caused by the finite thickness of the branch is ignored. For the branch 5', 5" being cladded on three sides as in the example of FIG. 4, the magnetic field H is given by the equation H=I/w, which is a factor of two larger than the uncladded branch. While the branches 5', 5" are represented with a rectangular cross section in FIG. 4, it will be understood that other forms or shapes of the branches 5', 5" could be used and all such forms or shapes can incorporate the described sides, and can include a width and a depth.

In a variant of the embodiment, the cladding can comprise a soft ferromagnetic material. The soft ferromagnetic material can include ferromagnetic materials that have high magnetic permeability, such as NiFeCo alloys. With a high permeability, the cladding magnetization rotates in response to the generated magnetic field which enables the focusing and enhancement of the magnetic field 52', 52" in the portion of the branch 5', 5" comprising the cladding 6. Moreover, in the region of the first and second magnetic tunnel junctions 2, 2', the magnetic field 52', 52" has a component being substantially parallel to the plan of the ferromagnetic layer magnetization being written (or read).

Figure 5:
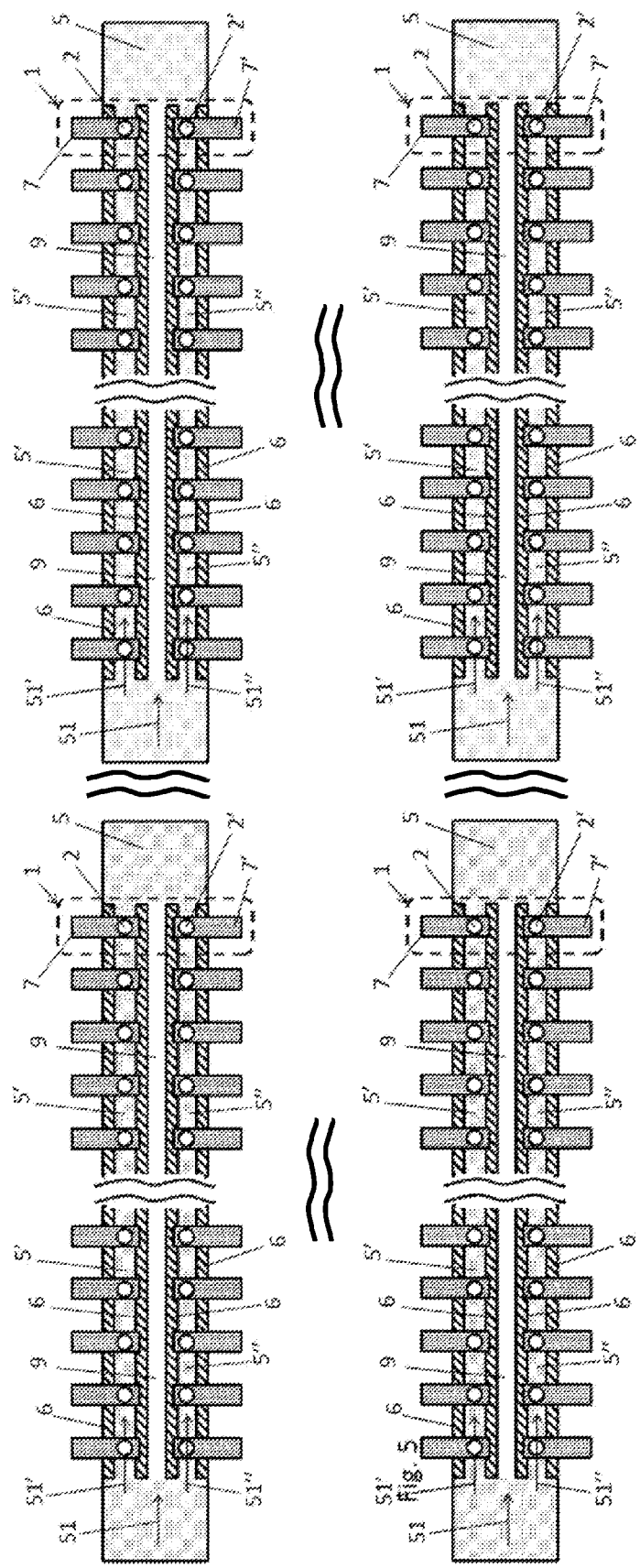
FIG. 5 is a top view showing a self-reference MRAM device comprising a plurality of the MRAM elements, according to an embodiment.

FIG. 5 is a top view showing a self-reference MRAM device comprising a plurality of the MRAM elements 1, according to an embodiment. More particularly, FIG. 5 shows the common field line 5 extending along a row of MRAM elements 1 such as to address the MRAM elements 1 along this row. The field line 5 comprises the first branch 5' extending along the first magnetic tunnel junctions 2 and the second branch 5" extending along the second magnetic tunnel junctions 2'. The two ends of the field line 5 are electrically connected such that when the field current 51 is passed in the field line, the first portion 51' of the field current passes in the first branch 5', addressing the first magnetic tunnel junctions 2, and the second portion 51" of the field current passes in the second branch 5", addressing the second magnetic tunnel junctions 2'. In this arrangement, the first portion 51' of the field current can generate the first portion 52' of magnetic field adapted to selectively vary the magnetoresistance of the first magnetic tunnel junctions 2 along the row, and the second portion 51" of the field current can generate the second portion 52" of magnetic field adapted to selectively vary the magnetoresistance of the second magnetic tunnel junctions 2' along the row. In the particular arrangement of FIG. 5, the two substantially parallel branches 5', 5" are formed by an opening 9 provided in the common field line 5.

Figure 6:
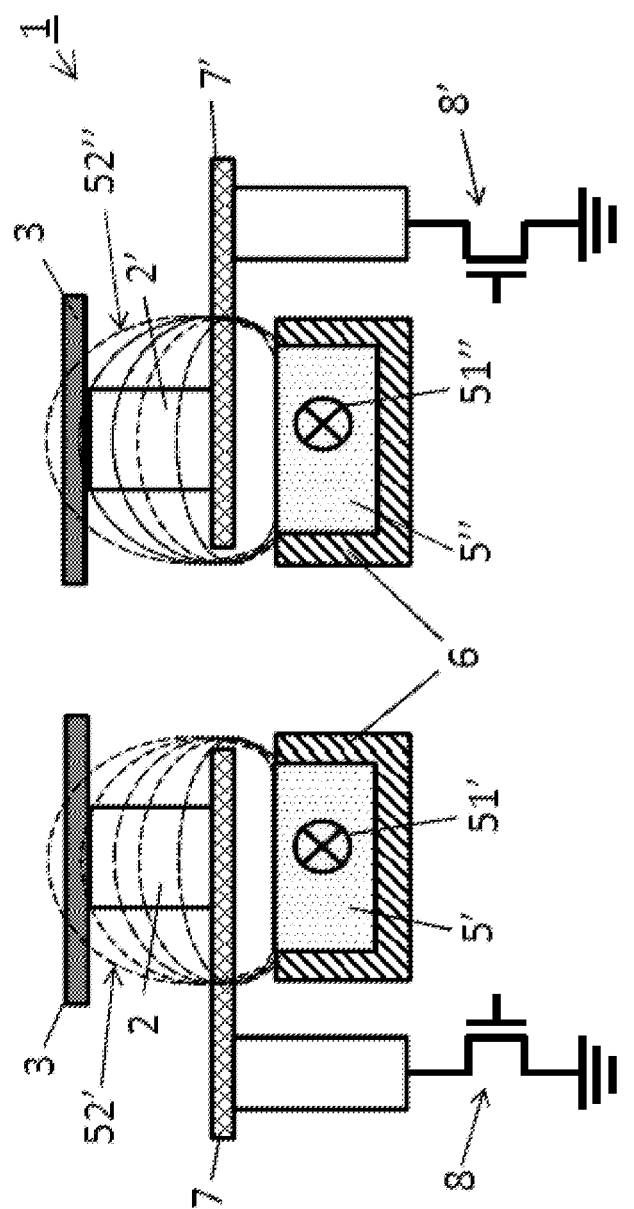
FIG. 6 represents the self-reference MRAM element according to another embodiment.

FIG. 6 represents the self-reference MRAM element 1 according to another embodiment, wherein the current line 3 is arranged substantially parallel to the first and second branches 5', 5".

REFERENCE NUMBERS

1 magnetic random access memory (MRAM) element
2 first magnetic tunnel junction
2' second magnetic tunnel junction
3 current line
5 field line
5' first branch
5" second branch
51 field current
51' first portion of field current
51" second portion of field current
52' first magnetic field
52" second magnetic field
6 cladding
7 first strap
7' second strap
8 first selection transistor
8' second selection transistor
9 opening
H magnetic field
I current
w width

The invention claimed is:

1. Self-reference-based MRAM element comprising
a first magnetic tunnel junction and a second magnetic tunnel junction, each having a magnetoresistance that can be varied; and
a single field line only for passing a field current destined to vary the magnetoresistance of the first and second magnetic tunnel junctions;
the single field line comprising a first branch and a second branch, each branch comprising a cladding;
the first branch being arranged for passing a first portion of the field current so as to generate a magnetic field which can exclusively selectively vary the magnetoresistance of the first magnetic tunnel junction,
and the second branch being electrically connected in parallel with the first branch and arranged for passing a second portion of the field current so as to generate a magnetic field which can exclusively selectively vary the magnetoresistance of the second magnetic tunnel junction; wherein
the cladding for the first and second branches is provided on their respective surfaces, and wherein a portion of the surface of the first branch which is closest to the first magnetic tunnel junction is free of cladding so that said portion of the surface is exposed, and a portion of the surface of the second branch which is closest to the second magnetic tunnel junction is free of cladding so that said portion of the surface is exposed, so that a first portion of magnetic field generated by passing the first portion of field current in the first branch can only vary the magnetization of the first magnetic tunnel junction and so that said first portion of magnetic field is concentrated on the first magnetic tunnel junction so that the first portion of magnetic field alone can vary the magnetization of the first magnetic tunnel junction, and a second portion of magnetic field generated by passing the second portion of field current in the second branch can only vary the magnetization of the second magnetic tunnel junction and so that said second portion of magnetic field is concentrated on the second magnetic tunnel junction so that the second portion of magnetic field alone can vary the magnetization of the second magnetic tunnel junction.

2. The MRAM element according to claim 1, wherein each of said first and second branches has a rectangular cross section, and wherein the cladding is provided on three sides of the rectangular cross section.

3. The MRAM element according to claim 1, wherein the cladding comprises a ferromagnetic material.

4. The MRAM element according to claim 3, wherein the ferromagnetic material comprises a NiFeCo alloy.

5. The MRAM element according to claim 1, further comprising at least one current line electrically connected to one end of each of the first and second magnetic tunnel junctions.

6. MRAM device comprising a plurality of MRAM elements, each MRAM element comprising:
a first magnetic tunnel junction and a second magnetic tunnel junction each having a magnetoresistance that can be varied; and
a single field line only for passing a field current destined to vary the magnetoresistance of the first and second magnetic tunnel junctions;
the single field line comprising a first branch and a second branch, each branch comprising a cladding; the first branch being arranged for passing a first portion of the field current so as to generate a magnetic field which can exclusively selectively vary the magnetoresistance of the first magnetic tunnel junction, and the second branch being electrically connected in parallel with the first branch and arranged for passing a second portion of the field current so as to generate a magnetic field which can exclusively selectively vary the magnetoresistance of the second magnetic tunnel junction;
wherein the first and second branches are arranged so that a first portion of magnetic field generated by passing the first portion of field current in the first branch can only vary the magnetization of the first magnetic tunnel junction and so that said first portion of magnetic field is concentrated on the first magnetic tunnel junction so that the first portion of magnetic field alone can vary the magnetization of the first magnetic tunnel junction, and a second portion of magnetic field generated by passing the second portion of field current in the second branch can only vary the magnetization of the second magnetic tunnel junction and so that said second portion of magnetic field is concentrated on the second magnetic tunnel junction so that the second portion of magnetic field alone can vary the magnetization of the second magnetic tunnel junction.

7. The MRAM device according to claim 6, wherein said plurality of the MRAM elements are arranged in rows and columns, and wherein the field line extends along a row of MRAM elements with the first branch extending along the first magnetic tunnel junctions such as to selectively vary the magnetoresistance of each of the first magnetic tunnel junction of the plurality of MRAM elements in the row when the first portion of the field current is passed, and with the second branch extending along the second magnetic tunnel junctions such as to selectively vary the magnetoresistance of each of the second magnetic tunnel junction of the plurality MRAM elements in the row when the second portion of the field current is passed.

8. The MRAM device according to claim 7, wherein the first branch is electrically connected with the second branch at each end of the row.

9. Self-reference-based MRAM element comprising
a first magnetic tunnel junction and a second magnetic tunnel junction, each having a magnetoresistance that can be varied; and
a single field line for passing a field current destined to vary the magnetoresistance of the first and second magnetic tunnel junctions; the single field line comprising an opening which is located between opposite ends of said single field line which defines a first branch and a second branch between the opposite ends of the single field line; and wherein both the first branch and second branch comprises a cladding;
the first branch being arranged for passing a first portion of the field current so as to generate a magnetic field which can exclusively selectively vary the magnetoresistance of the first magnetic tunnel junction,
and the second branch being electrically connected in parallel with the first branch and arranged for passing a second portion of the field current so as to generate a magnetic field which can exclusively selectively vary the magnetoresistance of the second magnetic tunnel junction; wherein
the first and second branches each comprise cladding provided on their respective surfaces, and wherein a portion of the surface of the first branch which is closest to the first magnetic tunnel junction is free of cladding so that said portion of the surface is exposed, and a portion of the surface of the second branch which is closest to the second magnetic tunnel junction is free of cladding so that said portion of the surface is exposed, so that a first portion of magnetic field generated by passing the first portion of field current in the first branch can only vary the magnetization of the first magnetic tunnel junction, and a second portion of magnetic field generated by passing the second portion of field current in the second branch can only vary the magnetization of the second magnetic tunnel junction.

10. A method of varying the magnetoresistance of two or more magnetic tunnel junctions in a self-reference-based MRAM element which comprises at least a first magnetic tunnel junction and a second magnetic tunnel junction, each having a magnetoresistance that can be varied; and a single field line for passing a field current destined to vary the magnetoresistance of the first and second magnetic tunnel junctions; the single field line comprising a first branch and a second branch both branch comprises a cladding, the first branch being arranged for passing a first portion of the field current so as to generate a magnetic field which can selectively vary the magnetoresistance of the first magnetic tunnel junction, and the second branch being electrically connected in parallel with the first branch and arranged for passing a second portion of the field current so as to generate a magnetic field which can selectively vary the magnetoresistance of the second magnetic tunnel junction, wherein the first and second branches each comprise cladding provided on their respective surfaces, and wherein a portion of the surface of the first branch which is closest to the first magnetic tunnel junction is free of cladding so that said portion of the surface is exposed, and a portion of the surface of the second branch which is closest to the second magnetic tunnel junction is free of cladding so that said portion of the surface is exposed, so that a first portion of magnetic field generated by passing the first portion of field current in the first branch can only vary the magnetization of the first magnetic tunnel junction, and a second portion of magnetic field generated by passing the second portion of field current in the second branch can only vary the magnetization of the second magnetic tunnel junction, the method comprising the steps of:
passing a field current into the single field line;
passing a first portion of the field current along the first branch so as to generate a magnetic field, and using exclusively said generated magnetic field to vary the magnetoresistance of the first magnetic tunnel junction; and
passing a second portion of the field current along the second branch so as to generate a magnetic field, and using exclusively said generated magnetic field to vary the magnetoresistance of the second magnetic tunnel junction.

11. A method according to claim 10 wherein the first portion of the field current and second portion of the field current are passed in the same direction along the respective first and second branches.

* * * * *